(12) United States Patent
Diamanti et al.

(10) Patent No.: US 10,959,344 B2
(45) Date of Patent: Mar. 23, 2021

(54) OUTDOOR ELECTRICAL APPARATUS HAVING AN OUTER HOUSING ARRANGED TO SELECTIVELY ENCASE A MAIN ENCAPSULANT

(71) Applicant: Trench Limited, Scarborough (CA)

(72) Inventors: Paolo Diamanti, Maple (CA); Jayakumar Harinathan, Scarborough (CA); Rosario Presta, Stouffville (CA)

(73) Assignee: TRENCH LIMITED, Scarborough (CA)

( * ) Notice: Subject to any disclaimer, the term of this patent is extended or adjusted under 35 U.S.C. 154(b) by 281 days.

(21) Appl. No.: 16/145,568

(22) Filed: Sep. 28, 2018

(65) Prior Publication Data
US 2019/0141850 A1 May 9, 2019

Related U.S. Application Data

(60) Provisional application No. 62/568,855, filed on Oct. 6, 2017.

(51) Int. Cl.
*H02G 3/08* (2006.01)
*H05K 5/00* (2006.01)
(Continued)

(52) U.S. Cl.
CPC ............. *H05K 5/065* (2013.01); *C08G 59/00* (2013.01); *C08G 59/24* (2013.01); *C08G 59/245* (2013.01);
(Continued)

(58) Field of Classification Search
CPC .......... H02G 3/08; H02G 3/081; H05K 5/065; H05K 5/02; H05K 5/00; H05K 5/06;
(Continued)

(56) References Cited

U.S. PATENT DOCUMENTS

| 4,346,145 | A | * | 8/1982 | Choi | ................. | H01B 7/0823 |
| | | | | | | 174/120 SR |
| 5,047,260 | A | * | 9/1991 | Durand | ............... | C09D 11/101 |
| | | | | | | 174/36 |

(Continued)

FOREIGN PATENT DOCUMENTS

WO 2008127575 A1 10/2008

*Primary Examiner* — Angel R Estrada

(57) ABSTRACT

An outdoor electrical apparatus (10) and methodology for manufacturing such apparatus are provided. The apparatus includes an electrical device (12), and an encapsulation housing system including a main encapsulant (11a) and an outer housing (11b). The main encapsulant may be arranged to encapsulate the electrical device, and the outer housing may be arranged to selectively encase surfaces of the main encapsulant based on an extent to which the surfaces of the main encapsulant otherwise would be subject to outdoor exposure. The main encapsulant comprises a bisphenol epoxy resin, and the outer housing comprises a cycloaliphatic epoxy resin to provide weatherability and resistance to ultraviolet (UV) radiation. This approach of selectively encasing surfaces of the main encapsulant with the outer housing, based on a relatively lower cost epoxy resin, is effective to balance competing demands, such as reducing a total monetary cost of the encapsulation housing system while meeting requisites regarding weatherability and UV radiation resistance.

22 Claims, 5 Drawing Sheets

(51) Int. Cl.
  *H05K 5/06* (2006.01)
  *C08G 59/00* (2006.01)
  *H05K 5/02* (2006.01)
  *C08G 59/24* (2006.01)
  *C08L 63/00* (2006.01)
  *H01F 27/32* (2006.01)
  *H01F 37/00* (2006.01)

(52) U.S. Cl.
  CPC .............. *C08L 63/00* (2013.01); *H01F 27/32* (2013.01); *H01F 37/00* (2013.01); *H05K 5/0217* (2013.01); *H01F 27/327* (2013.01)

(58) Field of Classification Search
  CPC ....... H05K 5/0217; H01F 27/32; H01F 37/00; H01F 27/327; C08G 59/00; C08G 59/24; C08G 59/245; C08L 63/00
  USPC ...... 174/50, 50.5, 520, 521, 535, 559, 17 R, 174/140 C, 140 H; 220/3.2–3.9, 4.02; 361/600, 601, 602, 603, 605, 620, 641, 361/659, 679.01
  See application file for complete search history.

(56) References Cited

U.S. PATENT DOCUMENTS

| | | | | |
|---|---|---|---|---|
| 5,180,513 | A * | 1/1993 | Durand | C09D 11/101 174/377 |
| 6,492,589 | B1 * | 12/2002 | Smith | H05K 5/0213 174/50 |
| 8,076,574 | B2 * | 12/2011 | Irmer | H02B 1/308 174/50 |
| 8,399,577 | B2 * | 3/2013 | Singh | C08L 63/00 525/524 |
| 8,436,079 | B2 | 5/2013 | Beisele | |
| 8,456,814 | B2 * | 6/2013 | Gerovac | H02B 1/301 361/679.01 |
| 8,599,540 | B2 * | 12/2013 | Fernandez | H05K 7/186 361/679.01 |
| 9,034,776 | B2 | 5/2015 | Costantino et al. | |
| 9,403,185 | B2 | 8/2016 | Beigel et al. | |
| 9,558,868 | B2 | 1/2017 | Beisele | |
| 9,640,314 | B2 | 5/2017 | Singh et al. | |
| 2010/0143639 | A1 * | 6/2010 | Le | H01B 3/40 428/76 |

\* cited by examiner

OUTDOOR ELECTRICAL APPARATUS HAVING AN OUTER HOUSING ARRANGED TO SELECTIVELY ENCASE A MAIN ENCAPSULANT

This application claims benefit of the Oct. 6, 2017 filing date of application 62/568,855 which is incorporated by reference herein.

BACKGROUND

1. Field

Disclosed embodiments relate generally to the field of electrical apparatuses, and, more particularly, to outdoor electrical apparatuses having a dry-type construction with an encapsulation system and methodology for making such apparatuses.

2. Description of the Related Art

Outdoor electrical apparatuses (such as reactors, transformers, etc.) having a dry-type construction may include at least one electrical component (such as conductor winding packages containing one or more conductor windings, etc.) encapsulated in an insulating material disposed to insulate and seal the electrical component from the outside environment.

For imparting outdoor UV (ultra-violet) solar radiation resistance and hydrophobic performance characteristics, the following prior art approaches have been employed to date in connection with certain outdoor electrical apparatuses: 1) encapsulation with a bisphenol-based resin—which is a relatively inexpensive resin and capable of providing appropriate thermal, mechanical and dielectric performance but typically subject to UV degradation—and, to compensate the vulnerability of such a resin to UV radiation, this approach may additionally involve applying a coating of an UV-resistant paint, which tends to be time consuming and adds to the cost of the encapsulation system; and 2) use of a UV resistant resin encapsulation system, such as a cycloaliphatic resin,—which may provide adequate protection against UV radiation, but which is relatively costlier compared to the bisphenol-based resin, and, this economic consideration may preclude its widespread use. Consequently, neither of the foregoing prior art approaches is fully satisfactory and further improvements are desired.

International publication number WO 2008/127575 A1 discloses a plastic encasement for an outdoor electrical device that includes an outer shell and an inner shell made up of different resins, where the inner shell is arranged to be relatively more flexible than the outer shell. Thus, this publication purports to provide a plastic encasement for an outdoor electrical device with inner and outer shells having different tensile elongation properties.

BRIEF DESCRIPTION

A disclosed embodiment is directed to an outdoor electrical apparatus including an electrical device, and an encapsulation housing system including a main encapsulant and an outer housing. The main encapsulant may be arranged to encapsulate the electrical device, and the outer housing may be arranged to selectively encase surfaces of the main encapsulant based on an extent to which the surfaces of the main encapsulant otherwise would be subject to outdoor exposure. The main encapsulant comprises a bisphenol epoxy resin, and the outer housing comprises a cycloaliphatic epoxy resin arranged to provide weatherability and resistance to ultraviolet (UV) radiation to the outer housing of the encapsulation housing system.

A further disclosed embodiment is directed to a method of manufacturing an outdoor electrical apparatus. The method includes encapsulating an electrical device of the outdoor electrical apparatus with a main encapsulant of an encapsulation housing system, and selectively encasing surfaces of the main encapsulant with an outer housing of the encapsulation housing system based on an extent to which the surfaces of the main encapsulant otherwise would be subject to outdoor exposure. The main encapsulant comprises a bisphenol epoxy resin, and the outer housing comprises a cycloaliphatic epoxy resin arranged to provide weatherability and resistance to ultraviolet (UV) radiation to the outer housing of the encapsulation housing system.

DETAILED DESCRIPTION

Disclosed embodiments are expected to provide a reliable and cost-effective encapsulation housing system for outdoor electric apparatuses (such as reactors, transformers, etc.) having a dry-type construction, where the encapsulation housing system appropriately combines in complementary fashion structural and/or operational features offered by different epoxy resins, such as a bisphenol epoxy resin and a cycloaliphatic epoxy resin.

Disclosed embodiments propose an arrangement utilizing the relatively lower cost bisphenol epoxy resin, as a main encapsulant; and utilizing the relatively higher cost cycloaliphatic epoxy resin in a complementary arrangement, as an outer housing arranged to selectively encase surfaces of the main encapsulant, such as may be based on an extent to which such surfaces of the main encapsulant otherwise would be subject to outdoor exposure. This approach of selectively encasing surfaces of the main encapsulant with the outer housing based on the cycloaliphatic epoxy resin is effective to appropriately balance competing demands, such as reducing a total monetary cost of the encapsulation housing system while meeting requisites of the outdoor electrical apparatus regarding weatherability and UV radiation resistance.

In the following detailed description, various specific details are set forth in order to provide a thorough understanding of such embodiments. However, those skilled in the art will understand that disclosed embodiments may be practiced without these specific details that the aspects of the present invention are not limited to the disclosed embodiments, and that aspects of the present invention may be practiced in a variety of alternative embodiments. In other instances, methods, procedures, and components, which would be well-understood by one skilled in the art have not been described in detail to avoid unnecessary and burdensome explanation.

Furthermore, various operations may be described as multiple discrete steps performed in a manner that is helpful for understanding embodiments of the present invention. However, the order of description should not be construed as to imply that these operations need be performed in the order they are presented, nor that they are even order dependent, unless otherwise indicated. Moreover, repeated usage of the phrase "in one embodiment" does not necessarily refer to the same embodiment, although it may. It is noted that disclosed embodiments need not be construed as mutually exclusive embodiments, since aspects of such disclosed embodiments may be appropriately combined by one skilled in the art depending on the needs of a given application.

Figure 1:
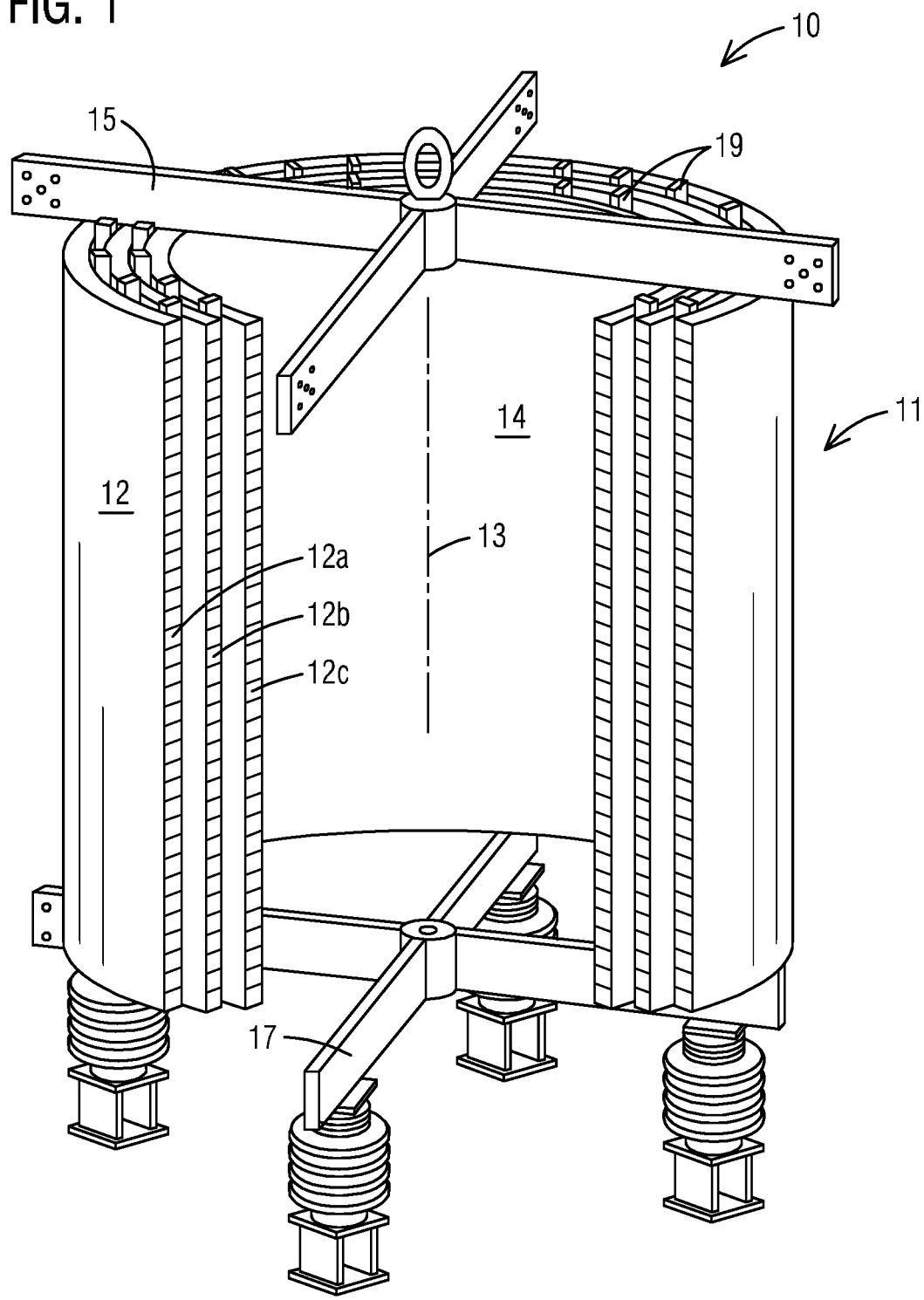
FIG. 1 is a fragmentary, cut-away view of an electrical apparatus, such as a dry-type air core reactor, that can benefit from a disclosed encapsulation housing system.

FIG. 1 is a fragmentary, cut-away view of an outdoor electrical apparatus, such an air core reactor 10 that can benefit from a disclosed encapsulation housing system 11, described in greater detail below. The terms air core reactor, air core inductor and air core coil are often used interchangeably by those skilled in the art and refer to inductors that involve an air core in lieu of a magnetic core made of a ferromagnetic material. An inductor (reactor, or coil) is a passive electrical component that may be used to store energy available in an electromagnetic field.

Air core reactor 10 includes one or more electrical devices, such as a plurality of radially-concentric, spaced-apart conductor winding packages 12 positioned about a longitudinal axis 13 of air core reactor 10. Conductor winding packages 12 may define a centrally-disposed hollow cavity 14. It will be appreciated that other air core reactor designs may include fewer or substantially more conductor winding packages than shown in FIGS. 1 and 2 (e.g., ranging from one conductor winding package to twenty or more conductor winding packages). For simplicity of illustration, FIGS. 1 and 2 illustrate just three such conductor winding packages.

Without limitation, air core reactor 10 may include a radially outer-most conductor winding package 12a, an intermediate conductor winding package 12b and a radially inner-most conductor winding package 12c. Intermediate conductor winding package 12b represents conductor winding packages that may be disposed between radially inner-most conductor winding package 12c and radially outer-most conductor winding package 12a of the plurality of radially-concentric packages of conductor windings 12. Hollow cavity 13 and conductor winding packages 12 may be positioned between an upper spider unit 15 and a lower spider unit 17, which structurally may function as terminals for connecting power lines and/or for interconnecting the conductor winding packages in a desired electrical configuration, such as a parallel circuit arrangement. Conductor winding package 12a, 12b, 12c may be radially separated from one another by a plurality of circumferentially spaced-apart spacers 19, which may be positioned to have a vertical orientation extending in a direction parallel to axis 13.

Figure 2:
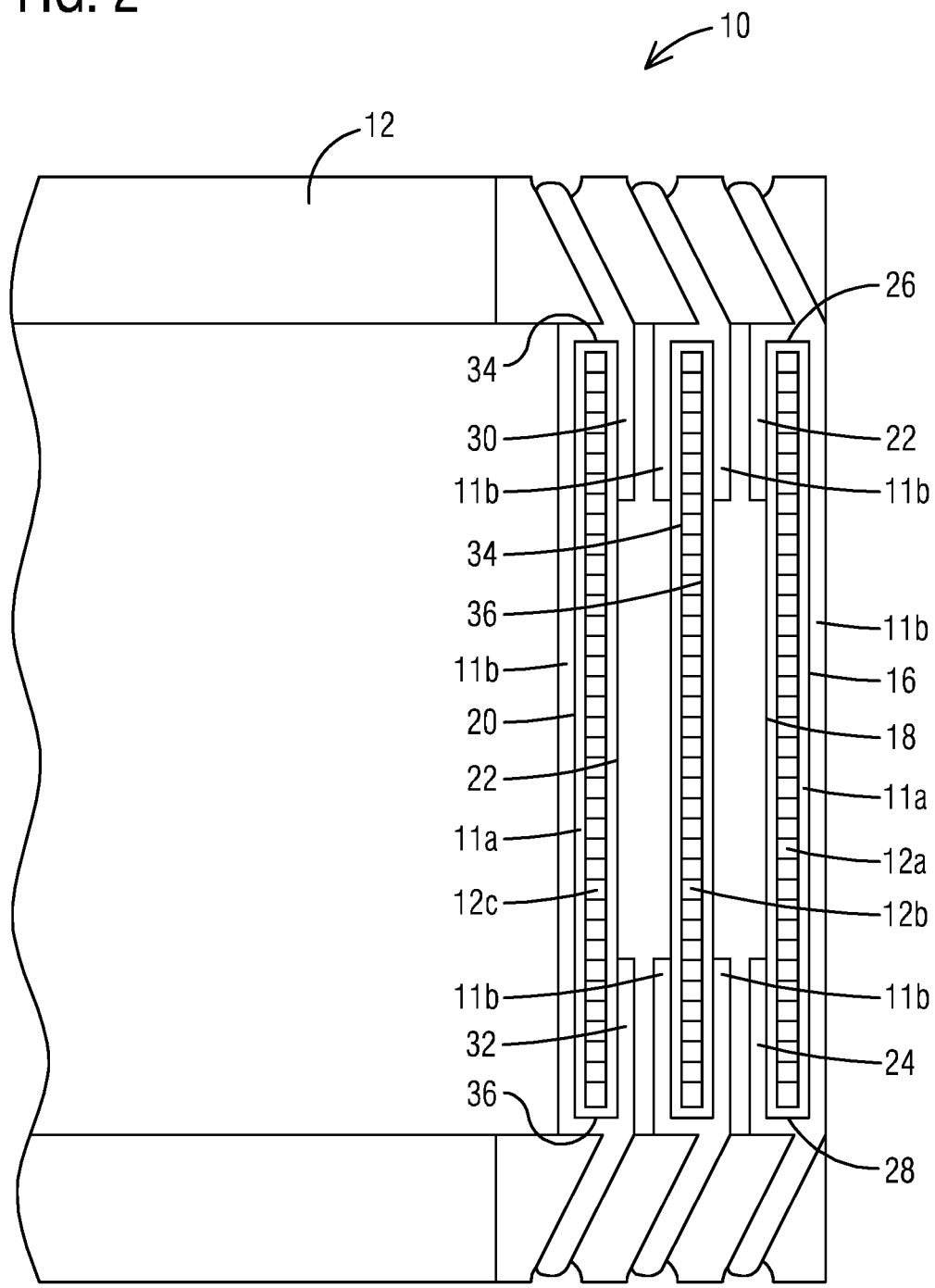
FIG. 2 is a cross-sectional view of conductor winding packages in the dry-type air core reactor, where such conductor winding packages can be appropriately insulated from the environment with one non-limiting embodiment of the disclosed encapsulation housing system.

In one non-limiting embodiment, as may be appreciated in FIG. 2, a main encapsulant 11a, such as a bisphenol-A epoxy resin, in a cured condition encapsulates each conductor winding package 12, and an outer housing 11b in a cured condition is arranged to selectively encase surfaces of main encapsulant 11a, such as may be based on an extent to which surfaces of main encapsulant 11a otherwise would be subject to outdoor exposure. That is, subject to outdoor exposure in the absence of outer housing 11b. In one non-limiting embodiment, outer housing 11b comprises a cycloaliphatic epoxy resin arranged to provide weatherability and resistance to ultraviolet (UV) radiation to outer housing 11b of encapsulation housing system 11.

It will be appreciated that a total monetary cost of encapsulation housing system 11 is based on a monetary cost of main encapsulant 11a associated with the bisphenol epoxy resin, and a monetary cost of outer housing 11b associated with the cycloaliphatic epoxy resin. Since the monetary cost associated with the cycloaliphatic epoxy resin is higher than the monetary cost associated with the bisphenol epoxy resin, then arranging outer housing 11b to selectively encase the surfaces of main encapsulant 11a is effective to reduce the total monetary cost of the encapsulation housing system 11 while meeting requisites of air core reactor 10 regarding weatherability and UV radiation resistance.

As may be appreciated in FIG. 2, an outer surface 16 of radially outer-most conductor winding package 12a of the plurality of radially-concentric packages of conductor windings 12 may be fully encased by outer housing 11b of encapsulation housing system 11. It will be appreciated that outer surface 16 of radially outer-most conductor winding package 12a is one example of a surface that, in the absence of outer housing 11b, would otherwise be exposed to the environment, e.g., the sun, rain, etc.

As may be further appreciated in FIG. 2, an inner surface 18 of radially outer-most conductor winding package 12a of the plurality of radially-concentric packages of conductor windings 12 may be partially encased by outer housing 11b of encapsulation housing system 11. For example, just upper and lower segments 22, 24 (e.g., encompassing approximately a range from approximately 8 cm to approximately 16 cm) of inner surface 18 (in addition to upper and lower annular edges 26, 28 that define the thickness of conductor winding package 12a) may be encased by outer housing 11b of encapsulation housing system 11 since intermediate conductor winding package 12b would block most of inner surface 18 from being fully exposed to the environment. It will be appreciated that outer surface 16 and inner surface 18 of radially outer-most conductor winding package 12a refer to relative radial positioning relative to axis 13.

An inner surface 20 of radially inner-most conductor winding package 12c of the plurality of radially-concentric packages of conductor windings may be fully encased by outer housing 11b of encapsulation housing system 11. It will be appreciated that inner surface 20 of radially inner-most conductor winding package 12c is another example of a surface that, in the absence of outer housing 11b, would otherwise be exposed to the environment, e.g., the sun, rain, etc. Conversely, an outer surface 22 of radially inner-most conductor winding package 12c of the plurality of radially-concentric packages of conductor windings may be partially encased by outer housing 11b of encapsulation housing system 11. For example, just upper and lower segments 30, 32 (e.g., encompassing a range of from approximately 8 cm to approximately 16 cm) of outer surface 22 (in addition to upper and lower annular edges 34, 36 that define the thickness of conductor winding package 12c) may be encased by outer housing 11b of encapsulation housing system 11 since in this case intermediate conductor winding package 12b would block most of outer surface 22 from being fully exposed to the environment. Once again, it will be appreciated that outer surface 22 and inner surface 20 of radially inner-most conductor winding package 12c refer to relative radial positioning relative to axis 13.

In connection with intermediate conductor winding package 12b of the plurality of radially-concentric packages of conductor windings 12, an outer surface 36 and an inner surface 34 of intermediate conductor winding package 12b may each be partially encased by outer housing 11b of encapsulation housing system 11. This partial encasement of outer surface 36 and inner surface 34 is as described above in the context of the partial encasing of inner surface 18 of radially outer-most conductor winding package 12a and the partial encasing of outer surface 22 of radially inner-most conductor winding package 12c.

Figure 3:
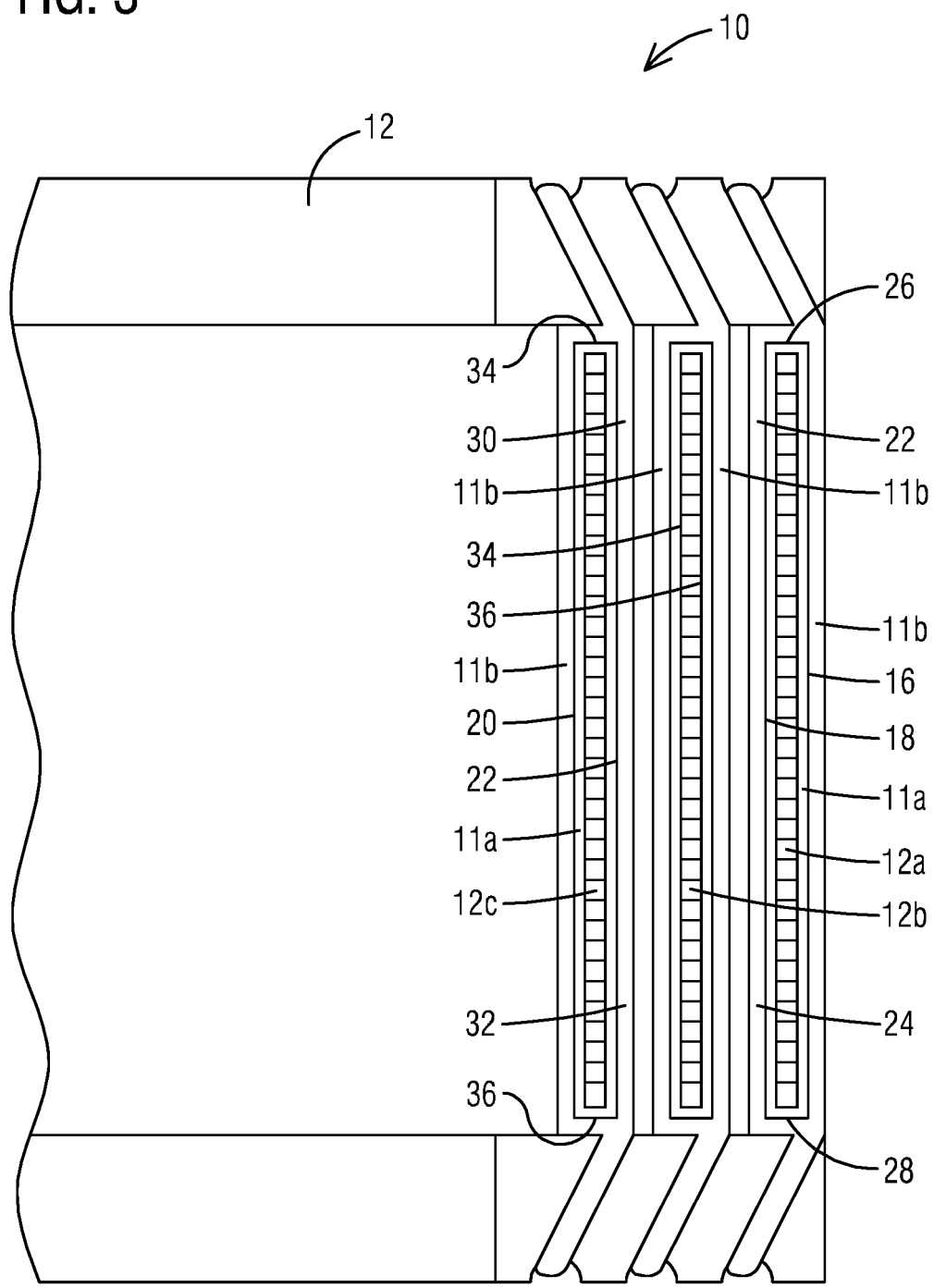
FIG. 3 is a cross-sectional view of conductor winding packages in the dry-type air core reactor, where such conductor winding packages are insulated from the environment with another non-limiting embodiment of the disclosed encapsulation housing system

FIG. 3 illustrates an embodiment where outer housing 11b may be arranged to fully encase every surface of main encapsulant 11a in each of the conductor winding packages 12 of air core reactor 10. For example, this may be desirable in certain applications where the cycloaliphatic epoxy resin in outer housing 11b may, for example, be tailored with appropriate resin fillers to optimize track resistance and increased dielectric withstand capabilities.

Figure 4:
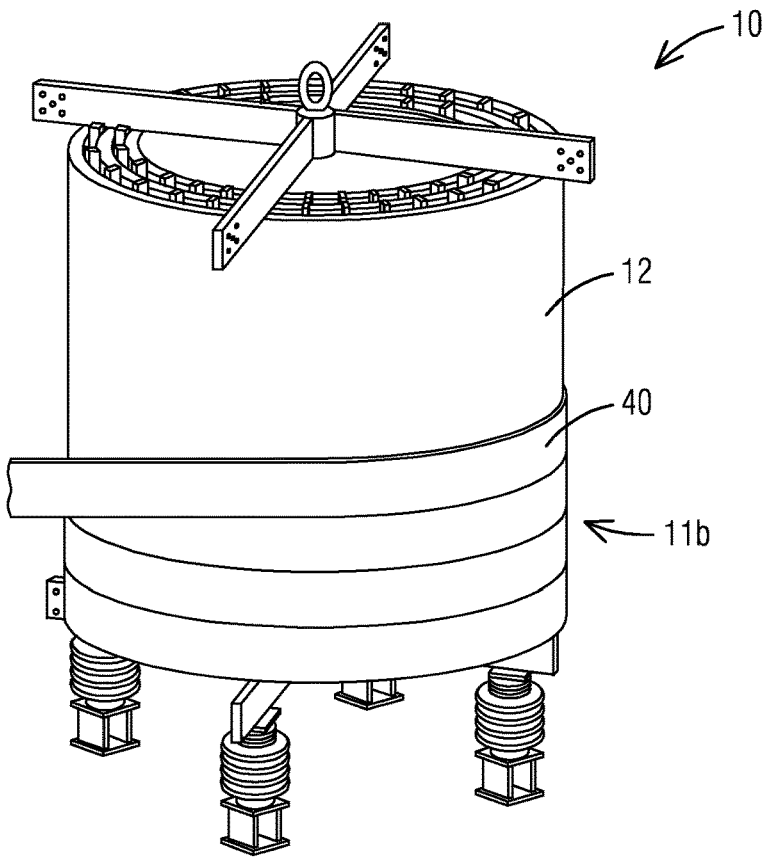
FIG. 4 is an isometric view illustrating one non-limiting technique for applying an outer housing of the disclosed encapsulation housing system to the dry-type air core reactor, such as by way of wrapping a fiberglass tape pre-impregnated with a cycloaliphatic based epoxy resin.

FIG. 4 is an isometric view illustrating one non-limiting technique for applying outer housing 11b of the disclosed encapsulation housing system to conductor winding package 12 of dry-type air core reactor 10, where conductor winding package 12 has been encapsulated with the main encapsulant, as noted above. In this example, outer housing 11b may be applied by way of wrapping a fiberglass tape 40 pre-impregnated with the cycloaliphatic based epoxy resin, which when cured forms outer housing 11b.

Figure 5:
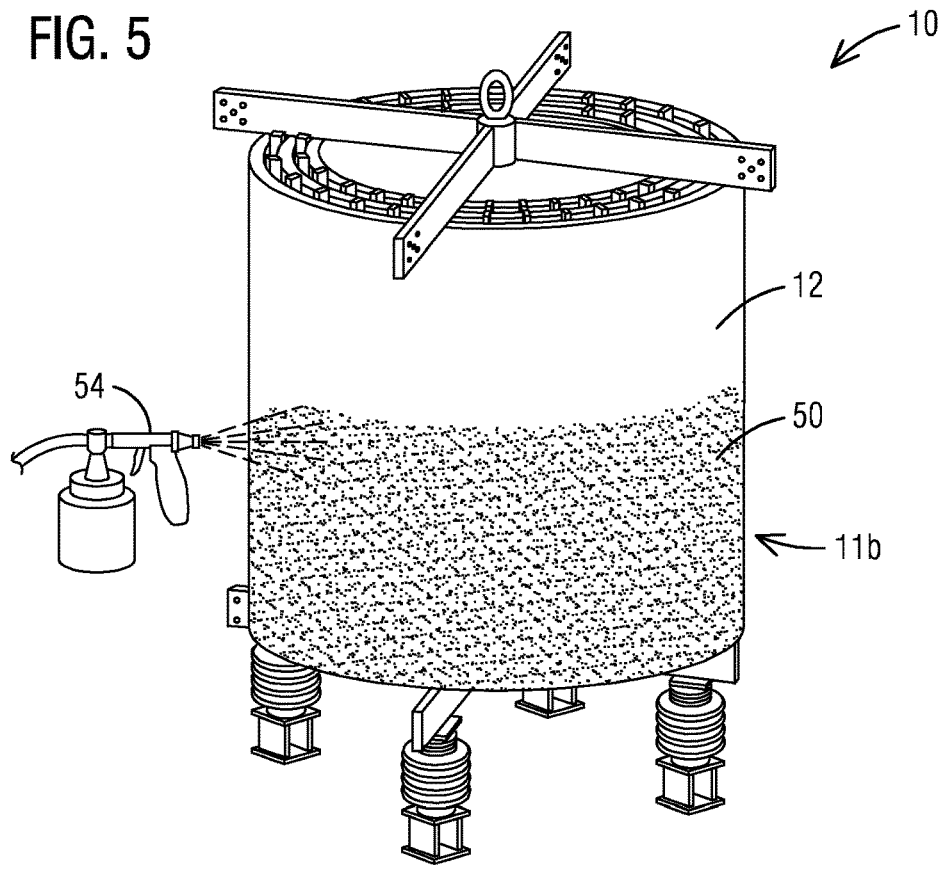
FIG. 5 is an isometric view illustrating another non-limiting technique for applying the outer housing of the disclosed encapsulation housing system to the electrical apparatus, such as by way of applying a liquified form or a paste form of the cycloaliphatic based epoxy resin.

FIG. 5 is an isometric view illustrating another non-limiting technique for applying outer housing 11b of the disclosed encapsulation housing system to conductor winding package 12 of dry-type air core reactor 10, where conductor winding package 12 has been encapsulated with the main encapsulant, as noted above. In this example, outer housing 11b may be placed by way of applying a coating 50 of one of the following onto the main encapsulant: a liquified form of the cycloaliphatic based epoxy resin, such as a sprayable liquid; or, alternatively, a paste form of the cycloaliphatic based epoxy resin, such as an extrudable or pumpable thixotropic paste, of the cycloaliphatic based epoxy resin. Coating 50, when cured, forms outer housing 11b.

FIG. 5 illustrates a spray gun 54 that may be utilized to apply coating 50 of the liquified form of the cycloaliphatic based epoxy resin onto the main encapsulant of conductor winding package 12. Alternatively, a paste applicator may be used to apply coating 50 of the paste form of the cycloaliphatic based epoxy resin onto the main encapsulant of conductor winding package 12. It will be appreciated that the foregoing forms of the cycloaliphatic based epoxy resin may be applied by way of various modalities, such as by way of spraying, rolling, brushing, or applying with a spatula or similar tool. It will be appreciated that the application of the cycloaliphatic based epoxy resin (regardless of the specific form of the cycloaliphatic based epoxy resin and/or modality of application) may be manually performed or may be automated by way of a robotic arm or other automation devices.

In one non-limiting embodiment, the bisphenol epoxy resin and the cycloaliphatic based epoxy resin may be configured with a curing behavior effective to form a joint interface (e.g., a reliable and long-lasting joint interface) between outer housing 11b and main encapsulant 11a.

In disclosed embodiments, the bisphenol epoxy resin and/or the cycloaliphatic epoxy resin may be appropriately engineered to form such a reliable and long-lasting joint interface (e.g., a bond) at the boundary of main encapsulant 11b and outer housing 11a. Without limitation, the bisphenol epoxy resin and/or the cycloaliphatic epoxy resin may be engineered to each have a relatively close thermal coefficient of expansion, and thus avoiding or at least reducing the possibility of surface cracks and delamination. Additionally, the bisphenol epoxy resin and/or the cycloaliphatic epoxy resin may be appropriately engineered with suitable, dielectrically stable, performance enhancing fillers/additives, such as Alumina Trihydrate $AL(OH)_3$ to, for example, be able to exothermically react during a common curing cycle without adverse thermal, mechanical or chemical reactions.

In one non-limiting embodiment, the cycloaliphatic epoxy resin may comprise a hydrophobic agent effective to provide a desired level of hydrophobicity to outer housing 11b. The cycloaliphatic epoxy resin may further comprise a thixotropic agent to provide a desired flow property to the cycloaliphatic epoxy resin effective to prevent a flow down of the cycloaliphatic epoxy resin, e.g., to prevent run down of the cycloaliphatic epoxy resin run down during the curing cycle. Lastly, the cycloaliphatic epoxy resin may comprise a pigmentation agent to provide a desired coloration to outer housing 11b. Without limitation, the desired coloration may comprise an ASA 70 gray color, a RAL 7032 green color, a white color or any other desired color.

Figure 6:
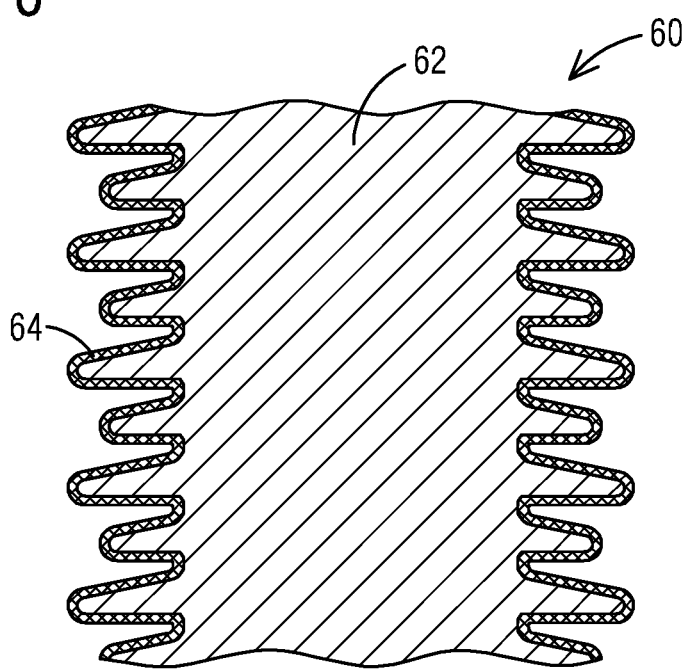
FIG. 6 is a cross-sectional view of a weather shed configured for an outdoor application with an alternative embodiment of a disclosed encapsulation housing system.

FIG. 6 is a cross-sectional view of a weather shed 60, such as may be used for insulating lines suspended outdoors that may be used for transmission of electric power. Weather shed 60 may be configured with an alternative embodiment of a disclosed encapsulation housing system. In this alternative embodiment, an inner core 62 of the encapsulation housing system may be molded based on the bisphenol epoxy resin to a desired shape and/or size configured to define a profile of weather shed 60. Upon partially or fully curing inner core 62, this inner core may then be transferred to a final mold for application of an outer housing 64 based on the cycloaliphatic epoxy resin arranged to provide weatherability and resistance to UV radiation to weather shed 60.

Figure 7:
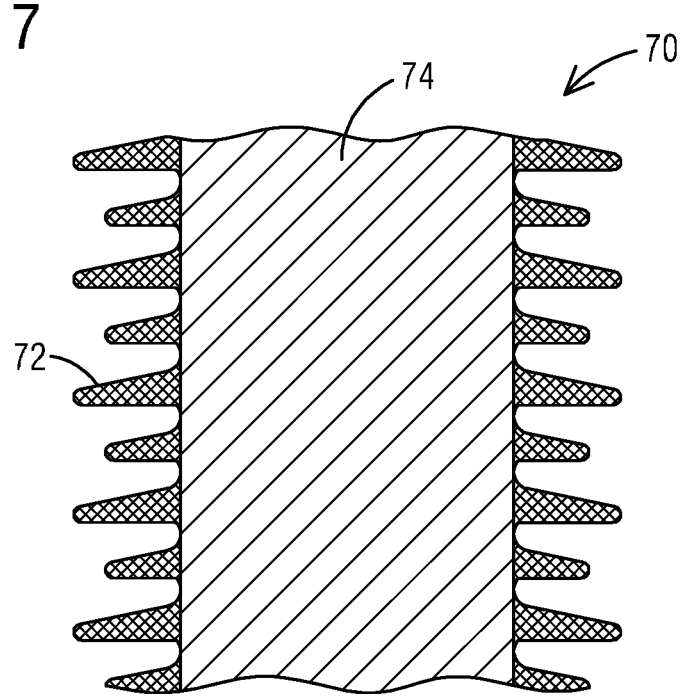
FIG. 7 is a cross-sectional view of a weather shed configured for an outdoor application with another alternative embodiment of a disclosed encapsulation housing system.

FIG. 7 is a cross-sectional view of a weather shed 70 configured with another alternative embodiment of a disclosed encapsulation housing system. In this another alternative embodiment, an outer housing 72 based on the cycloaliphatic epoxy resin may be molded to a desired shape and/or size configured to define the profile of weather shed 70 in a secondary outer mold that may be disposed about an inner core 74 so that outer housing 72 and inner core 74 form an integral structure with appropriate weatherability and resistance to UV radiation provided by outer housing 72.

From the foregoing disclosure, it should be appreciated that disclosed embodiments provide a reliable and cost-effective encapsulation housing system for outdoor electric apparatuses (such as reactors, transformers, etc.) having a dry-type construction, where the encapsulation housing system appropriately combines in complementary fashion structural and/or operational features offered by epoxy resins, such as a bisphenol epoxy resin and a cycloaliphatic epoxy resin. Disclosed embodiments appropriately balance competing demands, such as reducing the total monetary cost of the encapsulation housing system while meeting requisites of the outdoor electrical apparatus regarding weatherability and UV radiation resistance.

While embodiments of the present disclosure have been disclosed in exemplary forms, it will be apparent to those skilled in the art that many modifications, additions, and deletions can be made therein without departing from the scope of the invention and its equivalents, as set forth in the following claims.

What is claimed is:

1. An outdoor electrical apparatus comprising:
   an electrical device; and
   an encapsulation housing system comprising:
      a main encapsulation to encapsulate the electrical device, and
      an outer housing arranged to selectively encase surfaces of the main encapsulant based on an extent to which the surfaces of the main encapsulant otherwise would be subject to outdoor exposure,
      wherein the main encapsulant comprises a bisphenol epoxy resin, and
      wherein the outer housing comprises a cycloaliphatic epoxy resin arranged to provide weatherability and resistance to ultraviolet (UV) radiation to the outer housing of the encapsulation housing system,
   wherein the electrical device comprises an air core reactor including a plurality of radially-concentric packages of conductor windings encapsulated by the main encapsulant, the plurality of radially-concentric packages of conductor windings defining a centrally-disposed hollow cavity, in each package the main encapsulant defining an inner surface and an outer surface,
   wherein the outer surface of a radially outer-most package of the plurality of radially-concentric packages of conductor windings is fully encased by the outer housing of the encapsulation housing system.

2. The outdoor electrical apparatus of claim 1, wherein a total monetary cost of the encapsulation housing system is based on a monetary cost of the main encapsulant associated with the bisphenol epoxy resin, and a monetary cost of the outer housing associated with the cycloaliphatic epoxy resin,
   wherein the monetary cost associated with the cycloaliphatic epoxy resin is higher than the monetary cost associated with the bisphenol epoxy resin,
   wherein the outer housing being arranged to selectively encase the surfaces of the main encapsulant is effective to reduce the total monetary cost of the encapsulation housing system while meeting requisites of the outdoor electrical apparatus regarding weatherability and UV radiation resistance.

3. The outdoor electrical apparatus of claim 1, wherein the inner surface of the radially outer-most package of the plurality of radially-concentric packages of conductor windings is partially encased by the outer housing of the encapsulation housing system.

4. The outdoor electrical apparatus of claim 1, wherein the inner surface of a radially inner-most package of the plurality of radially-concentric packages of conductor windings is fully encased by the outer housing of the encapsulation housing system.

5. The outdoor electrical apparatus of claim 4, wherein the outer surface of the radially inner-most package of the radially-concentric packages of conductor windings is partially encased by the outer housing of the encapsulation housing system.

6. The outdoor electrical apparatus of claim 4, wherein the outer surface and the inner surface of an intermediate package of the plurality of radially-concentric packages of conductor windings is each partially encased by the outer housing of the encapsulation housing system,
   wherein the intermediate package of the plurality of radially-concentric packages of conductor windings is disposed between the radially inner-most package and the radially outer-most package of the plurality of radially-concentric packages of conductor windings.

7. The outdoor electrical apparatus of claim 4, wherein the bisphenol epoxy resin and/or the cycloaliphatic epoxy resin is configured with a curing behavior effective to form a joint interface between the outer housing and the main encapsulant.

8. The outdoor electrical apparatus of claim 1, wherein the cycloaliphatic epoxy resin comprises a hydrophobic agent effective to provide a desired level of hydrophobicity to the outer housing.

9. The outdoor electrical apparatus of claim 1, wherein the cycloaliphatic epoxy resin comprises a thixotropic agent to provide a desired flow property to the cycloaliphatic epoxy resin effective to prevent a flow down of the cycloaliphatic epoxy resin.

10. The outdoor electrical apparatus of claim 1, wherein the cycloaliphatic epoxy resin comprises a pigmentation agent to provide a desired coloration to the outer housing.

11. The outdoor electrical apparatus of claim 10, wherein the desired coloration is selected from the group consisting of an ASA 70 gray color, a RAL 7032 green color and a white color.

12. The outdoor electrical apparatus of claim 1, wherein the outer housing is formed by a fiberglass tape pre-impregnated with the cycloaliphatic based epoxy resin.

13. The outdoor electrical apparatus of claim 1, wherein the outer housing is formed by a cured coating applied in a liquified form or a paste form of the cycloaliphatic based epoxy resin.

14. An outdoor electrical apparatus comprising:
   an electrical device; and
   an encapsulation housing system comprising:
   a main encapsulation to encapsulate the electrical device, and
      an outer housing arranged to selectively encase surfaces of the main encapsulant based on an extent to which the surfaces of the main encapsulant otherwise would be subject to outdoor exposure,
      wherein the main encapsulant comprises a bisphenol epoxy resin, and
      wherein the outer housing comprises a cycloaliphatic epoxy resin arranged to provide weatherability and resistance to ultraviolet (UV) radiation to the outer housing of the encapsulation housing system,
   wherein the electrical device comprises an air core reactor including a plurality of radially-concentric packages of conductor windings encapsulated by the main encapsulant, the plurality of radially-concentric packages of conductor windings defining a centrally-disposed hollow cavity,
      wherein every surface of the main encapsulant in each package of the plurality of radially-concentric packages of conductor windings is fully encased with the outer housing of the encapsulation housing system.

15. A method of manufacturing an outdoor electrical apparatus comprising:
   encapsulating an electrical device of the outdoor electrical apparatus with a main encapsulant of an encapsulation housing system;
   selectively encasing surfaces of the main encapsulant with an outer housing of the encapsulation housing system based on an extent to which the surfaces of the main encapsulant otherwise would be subject to outdoor exposure,
   wherein the main encapsulant compriss a bisphenol epoxy resin, and
   wherein the outer housimg comprises a cycloaliphatic epoxy resin arranged to provide weatherability and resistance to ultraviolet (UV) radioation to the outer housing of the encapsulation housing system;
   fully encasing with the outer housing of the encapsulation housing system the inner surface of a radially inner-most package of the plurality of radially-concentric packages of conductor windings; and
   partially encasing with the outer housing of the encapsulation housing system the outer surface of the radially inner-most package of the radially-concentric packages of conductor windings.

16. The method of manufacturing the outdoor electrical apparatus of claim 15, further comprising partially encasing with the outer housing of the encapsulation housing system the outer surface and the inner surface of an intermediate package of the plurality of radially-concentric packages of conductor windings,
   wherein the intermediate package of the plurality of radially-concentric packages of conductor windings is disposed between the radially inner-most package and the radially outer-most package of the plurality of radially-concentric packages of conductor windings.

17. The method of manufacturing the outdoor electrical apparatus of claim 15, further comprising engineering the cycloaliphatic epoxy resin with at least one of the following agents:
   a hydrophobic agent providing a desired level of hydrophobicity to the outer housing;
   a thixotropic agent providing a desired flow property to the cycloaliphatic epoxy resin; and
   a pigmentation agent providing a desired coloration to the outer housing.

18. The method of manufacturing the outdoor electrical apparatus of claim 15, further comprising forming the outer housing onto an electrical device encapsulated with the main encapsulant by way of wrapping a fiberglass tape pre-impregnated with the cycloaliphatic based epoxy resin onto the electrical device, and then curing the wrapped fiberglass tape pre-impregnated with the cycloaliphatic based epoxy resin.

19. The outdoor electrical apparatus of claim 15, wherein the electrical device comprises an air core reactor including a plurality of radially-concentric packages of conductor windings encapsulated by the main encapsulant, the plurality of radially-concentric packages of conductor windings defining a centrally-disposed hollow cavity, the method further comprising:
   fully encasing with the outer housing of the encapsulation housing system every surface of the main encapsulant in each package of the plurality of radially-concentric packages of conductor windings.

20. The method of manufacturing the outdoor electrical apparatus of claim 15, wherein the electrical device comprises an air core reactor including a plurality of radially-concentric packages of conductor windings encapsulated by the main encapsulant, the plurality of radially-concentric packages of conductor windings defining a centrally-disposed hollow cavity, in each package the main encapsulant defining an inner surface and an outer surface, the method further comprising:
   fully encasing with the outer housing of the encapsulation housing system the outer surface of a radially outer-most package of the plurality of radially-concentric packages of conductor windings; and
   partially encasing with the outer housing of the encapsulation housing system the inner surface of the radially outer-most package of the plurality of radially-concentric packages of conductor windings.

21. A method of manufacturing an outdoor electrical apparatus comprising:
   encapsulating an electrical device of the outdoor electrical apparatus with a main encapsulant of an encapsulation housing system; and
   selectively encasing surfaces of the main encapsulant with an outer housing of the encapsulation housing system based on an extent to which the surfaces of the main encapsulant otherwise would be subject to outdoor exposure,
   wherein the main encapsulant comprises a bisphenol epoxy resin, and
   wherein the outer housing comprises a cycloaliphatic epoxy resin arranged to provide weatherability and resistance to ultraviolet (UV) radiation to the outer housing of the encapsulation housing system; and
   forming a joint interface between the outer housing and the main encapsulant during a curing of the bisphenol epoxy resin and the cycloaliphatic epoxy resin.

22. A method of manufacturing an outdoor electrical apparatus comprising:
   encapsulating an electrical device of the outdoor electrical apparatus with a main encapsulant of an encapsulation housing system; and
   selectively encasing surfaces of the main encapsulant with an outer housing of the encapsulation housing system based on an extent to which the surfaces of the main encapsulant otherwise would be subject to outdoor exposure,
   wherein the main encapsulant comprises a bisphenol epoxy resin, and
   wherein the outer housing comprises a cycloaliphatic epoxy resin arranged to provide weatherability and resistance to ultraviolet (UV) radiation to the outer housing of the encapsulation housing system; and
   forming the outer housing onto an electrical device encapsulated with the main encapsulant by way of applying a coating of a paste form of the cycloaliphatic epoxy resin onto the electrical device, and then curing the applied coating of the paste form of the cycloaliphatic epoxy resin.

* * * * *